(12) United States Patent  (10) Patent No.: US 8,723,331 B2
Yamada                          (45) Date of Patent:  May 13, 2014

(54) SEMICONDUCTOR DEVICE

(75) Inventor: Noriteru Yamada, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 13/356,139

(22) Filed: Jan. 23, 2012

(65) Prior Publication Data

US 2012/0211898 A1  Aug. 23, 2012

(30) Foreign Application Priority Data

Feb. 18, 2011  (JP) ................. 2011-033210

(51) Int. Cl.
   *H01L 23/48*  (2006.01)
(52) U.S. Cl.
   USPC ........................................... 257/775
(58) Field of Classification Search
   USPC ................. 257/775, 774, 773, 784
   See application file for complete search history.

(56) References Cited

U.S. PATENT DOCUMENTS 7,915,733 B2   3/2011  Kudo
8,304,900 B2 * 11/2012  Jang et al. .............. 257/733

2008/0142977 A1  6/2008  Watanabe et al.
2009/0200676 A1  8/2009  Kudo
2011/0121460 A1  5/2011  Watanabe et al.

FOREIGN PATENT DOCUMENTS

| JP | 2-336 A | 1/1990 |
| JP | 2007-294586 | 11/2007 |
| JP | 2008-153549 | 7/2008 |
| JP | 2009-188263 | 8/2009 |

OTHER PUBLICATIONS

Office Action issued Jun. 25, 2013 in Japanese Patent Application No. 2011-033210 with English language translation.

* cited by examiner

*Primary Examiner* — Hoa B Trinh
(74) *Attorney, Agent, or Firm* — Oblon, Spivak, McClelland, Maier & Neustadt, L.L.P.

(57) ABSTRACT

Certain embodiments provide a semiconductor device including a first line, a second line, and a sacrificial line. The second line is connected to the first line, and has a narrower linewidth than the first line. The sacrificial line is a wiring having its one end connected to the first line, and its another end as an open end. Further, the sacrificial line at least partially has a portion with a narrower linewidth than the second line.

17 Claims, 5 Drawing Sheets

SEMICONDUCTOR DEVICE

CROSS REFERENCE TO RELATED APPLICATION

This application is based upon and claims the benefit of priority from the prior Japanese Patent Application No. 2011-033210 filed in Japan on Feb. 18, 2011; the entire contents of which are incorporated herein by reference.

FIELD

Embodiments described herein relate generally to semiconductor device.

BACKGROUND

In recent years, according to demands for refining and sophisticating a semiconductor device, a low dielectric constant film (hereafter denoted as a low-k film) is used as an interlayer insulating film. A patterning using an RIE (Reactive Ion Etching) is performed on such a low-k film, and after a wet processing, a barrier metal/Cu seed spattering, a Cu plating, a CMP (Chemical Mechanical Polishing) are sequentially performed, thereby a metal wiring layer such as a via, a line and the like is formed.

In such a metal wiring layer, there is a problem that a stress migration defect (hereafter denoted as an SM defect) is generated therein, and reliability and yield of the semiconductor device is decreased. The SM defect is a phenomenon in which the metal wiring layer is disconnected by heat or mechanical stress even if no current is flowing in the metal wiring layer.

DETAILED DESCRIPTION

Certain embodiments provide a semiconductor device including a first line, a second line, and a sacrificial line. The second line is connected to the first line, and has a narrower linewidth than the first line. The sacrificial line is a wiring having its one end connected to the first line, and its another end as an open end. Further, the sacrificial line at least partially has a portion with a narrower linewidth than the second line.

Hereinbelow, semiconductor devices of embodiments will be explained.

First Embodiment

Figure 1:
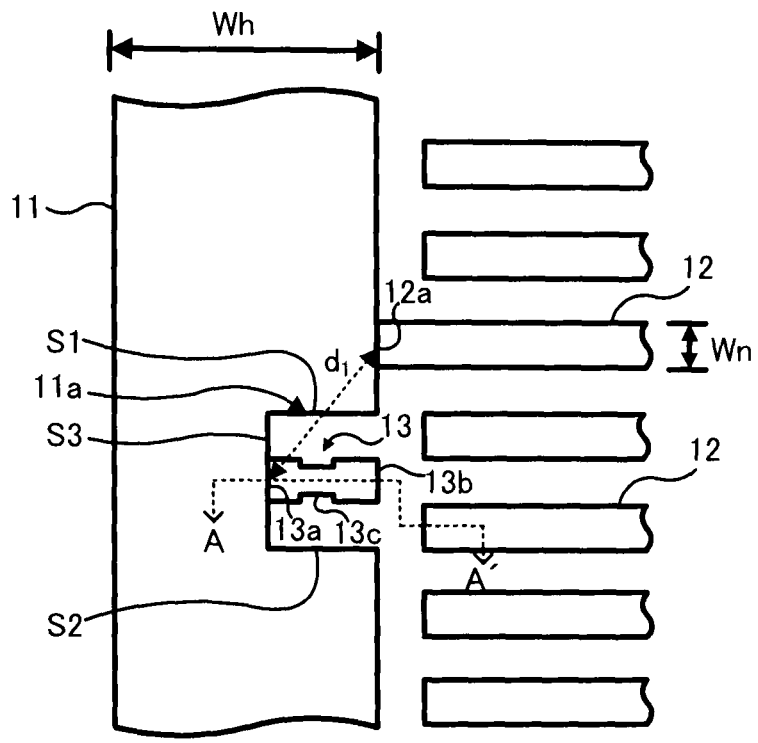
FIG. 1 is a top view showing a wiring pattern in a semiconductor device of a first embodiment.

FIG. 1 is a top view showing a wiring pattern in a semiconductor device of the present embodiment. As shown in FIG. 1, the semiconductor device of the present embodiment includes one wide-width line 11 and a plurality of narrow-width lines 12, for example. The narrow-width lines 12 are separated from one another, and are arranged in parallel. The wide-width line 11 and the narrow-width lines 12 are arranged such that their longitudinal directions intersect. In the present embodiment, the wide-width line 11 and the narrow-width lines 12 are arranged such that their longitudinal directions are vertical. A linewidth Wh of the wide-width line 11 is, for example, 0.5 μm or more, and a linewidth Wn of the narrow-width lines 12 is, for example, less than 0.1 μm.

A notched portion 11a with a concaved shape is provided on the wide-width line 11. The notched portion 11a is configured of two sides S1, S2 that are vertical to the longitudinal direction of the wide-width line 11, and one side S3 that is parallel to the longitudinal direction of the wide-width line 11.

One of the narrow-width lines 12 includes a connecting portion 12a at its one end. The narrow-width line 12 having the connecting portion 12a and the wide-width line 11 are connected to each other by the connecting portion 12a and a portion near the notched portion 11a being in contact.

In an area inside the notched portion 11a of the wide-width line 11, a sacrificial line 13 is arranged therein. The sacrificial line 13 is arranged in parallel to the narrow-width lines 12, and has a connecting portion 13a at its one end. The sacrificial line 13 and the wide-width line 11 are connected to each other by the connecting portion 13a of the sacrificial line 13 being in contact with the side S3 configuring the notched portion 11a. Further, another end 13b (the another end 13b that is opposite to the connecting portion 13a) of the sacrificial line 13 is an open end.

The aforementioned wide-width line 11 and narrow-width lines 12 connect two of another line, a via contact, and an element; or connect other lines, via contacts, or elements (not shown). Contrary to this, the sacrificial line 13 is connected to none of the another line, the via contact and the element other than the wide-width line 11. Note that, the above element means an active element such as an FET and the like, a passive element such as a capacitor, a resistance, and circuits configured by the aforementioned elements.

Figure 2:
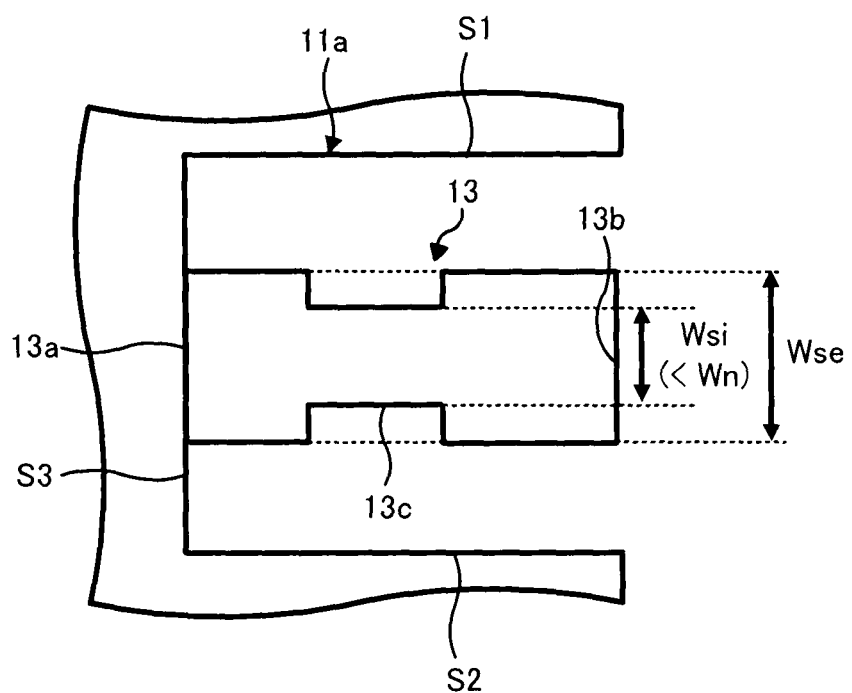
FIG. 2 is a top enlarged view showing a sacrificial line.

FIG. 2 is a top enlarged view showing the sacrificial line 13. As shown in FIG. 2, the sacrificial line 13 includes an intermediate portion 13c at an intermediate position between the one end (connecting portion 13a) and the another end 13b. The intermediate portion 13c is a portion where the SM defect occurs with priority over the connecting portion 12a of the narrow-width line 12, and its linewidth Wsi is partially narrowed more than the linewidth Wn of the narrow-width lines 12. Further, a linewidth Wse of the both ends 13a, 13b of the sacrificial line 13 is preferably wider than the linewidth Wn of the narrow-width lines 12. By making the linewidth Wse of the both ends 13a, 13b of the sacrificial line 13 wider than the linewidth Wn of the narrow-width lines 12, the SM defect can be made to occur surely at the intermediate portion 13c.

For example, if the linewidth Wh of the wide-width line 11 is 0.5 μm and the linewidth Wn of the narrow-width lines 12 is 0.1 μm, it is preferable that the linewidth Wsi of the intermediate portion 13c is less than 0.1 μm and 0.07 μm or more and less than the linewidth Wn of the narrow-width lines 12, and the linewidth Wse of the both ends 13a, 13b of the sacrificial line 13 is 0.1 µm or less and the linewidth Wn of the narrow-width lines 12 or more. However, the linewidth Wse of the both ends 13a, 13b of the sacrificial line 13 may be about the same as the linewidth Wn of the narrow-width lines 12.

Further, a length of the sacrificial line 13 in the longitudinal direction is preferably 0.3 µm or more and three times or more of its own linewidth and 0.5 µm or less. By forming the sacrificial line 13 as above, an increase in a chip area is suppressed, and the SM defect can further be made sure to occur at the intermediate portion 13c of the sacrificial line 13.

Note that, as shown in FIG. 1, the sacrificial line 13 is connected at a position within the wide-width line 11 near the connecting portion 12a of the narrow-width line 12, and it is preferable to make a distance $d_1$ between the connecting portion 12a of the narrow-width line 12 and the connecting portion 13a of the sacrificial line 13 to be as short as possible.

For example, if the linewidth Wh of the wide-width line 11 is 0.5 µm and the linewidth Wn of the narrow-width lines 12 is 0.1 µm, it is preferable that a center distance $d_1$ between the connecting portion 12a and the connecting portion 13a is 0.5 µm or less. As in this example, it is preferable that the center distance $d_1$ between the connecting portion 12a and the connecting portion 13a is at the linewidth Wh of the wide-width line 11 or less, or ten times the linewidth Wn of the narrow-width lines 12 or less. If the center distance $d_1$ exceeds the linewidth Wh, or ten times the linewidth Wn, it becomes difficult to cause the SM defect to occur at the intermediate portion 13c of the sacrificial line 13.

If the linewidth Wh of the wide-width line 11 is 0.5 µm and the linewidth Wn of the narrow-width lines 12 is 0.1 µm, it is preferable that the center distance $d_1$ is 0.3 µm or less. As in this example, it is preferable that the center distance $d_1$ is three times the linewidth Wn of the narrow-width lines 12 or less, or half the linewidth Wh of the wide-width line 11 or less. Further, in considering a manufacturing process of the sacrificial line 13, it is preferable that the center distance $d_1$ between the connecting portion 12a and the connecting portion 13a is 0.3 µm or more.

The wide-width line 11, the narrow-width lines 12, and the sacrificial line 13, for example, have a configuration in which a barrier metal (for example, Ta, Ti and the like), a Cu layer including a Cu seed are laminated in this order.

Figure 3:
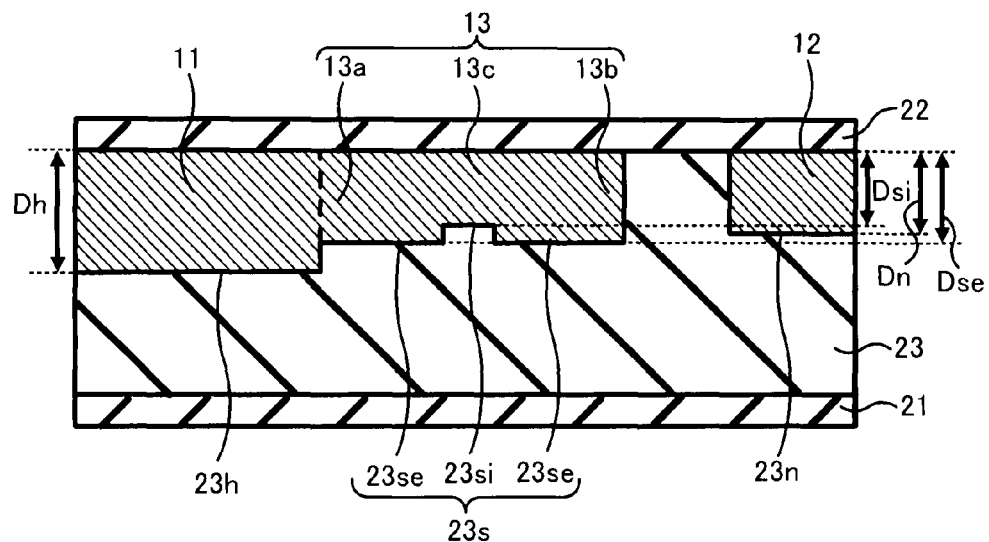
FIG. 3 is a sectional view taken along A-A' of FIG. 1.

FIG. 3 is a sectional view taken along A-A' of FIG. 1. As shown in FIG. 3, on a surface of an interlayer insulating film 23 between interlayer insulating films 21, 22, a groove 23h for forming the wide-width line 11, a groove 23n for forming the narrow-width line 12, and a groove 23s for forming the sacrificial line 13 are formed. The grooves are formed shallower as the linewidth becomes narrower, so a depth Dn of the groove 23n, depths Dse, Dsi of the groove 23s are respectively formed deeper than a depth Dh of the groove 23h.

The depth Dsi of the intermediate portion 23si of the groove 23s in which the intermediate portion 13c of the sacrificial line 13 is to be formed is formed partially shallower than the depth Dn of the groove 23n in which the narrow-width line 12 is to be formed. Further, both ends 23se of the groove 23s is formed deeper than the depth Dn of the groove 23n in which the narrow-width line 12 is to be formed.

The wide-width line 11 is formed in the groove 23h of the interlayer insulating film 23m, the narrow-width line 12 is formed in the groove 23n, and the sacrificial line 13 is formed in the groove 23s of the interlayer insulating film 23.

Note that, since the linewidth Wn of the narrow-width lines 12 and especially the linewidth Wsi of the center portion 13c of the sacrificial line are narrower than the linewidth Wn of the wide-width line 11, an embedding quality of the metal including a coverage of the barrier metal of the narrow-width lines 12 and the sacrificial line 13 is decreased relatively compared to the wide-width line 11. Further, the embedding quality of the metal including the coverage of the barrier metal of the center portion 13c of the sacrificial line 13 is decreased relatively compared to the narrow-width lines 12.

It has been already known that the SM defect tends to occur at a via chain which is a connecting portion of a lower-layer wiring and an upper-layer wiring. However, according to the refinement of the semiconductor device, it has been revealed that it also occurs in a wiring pattern in which the wide-width line and the narrow-width lines are connected. According to an analysis result of an SM acceleration test, it has been found out that a void is formed at the connecting portion of the wide-width line and the narrow-width line (a base of the narrow-width line). This phenomenon is thought to occur due to the coverage of the barrier metal and the Cu seed in the narrow-width line being relatively weaker compared to the wide-width line. Such a relative deterioration of the coverage is thought to further increase as the refinement of the semiconductor device is further enhanced.

In a design rule to suppress the SM defect from occurring in the via chain, generally, upper and lower linewidths and a fringe extension length of the via chain are restricted. If the design rule is adapted for suppressing the SM defect in the connecting portion of the wide-width line and the narrow-width line, the linewidth of the wide-width line must be narrowed. However, there are restrictions to narrowing the wide-width line from an aspect of designing. Further, it may also be considered to gradually shift the connecting portion from a narrow width to a wide width so as to suppress the SM defect at the connecting portion. However, in gradually shifting the line width of the connecting portion from narrow to wide, there also are limits in the aspect of designing, and the chip area is further increased. Accordingly, the method also cannot be said as being practical.

In this incident, as in the present embodiment, if the sacrificial line 13 including a portion having a narrower linewidth than the narrow-width line 12 is arranged near the portion where the wide-width line 11 and the narrow-width line 12 connect, the SM defect occurs in the portion having the narrower linewidth than the narrow-width line 12 (the intermediate portion 13c) in the sacrificial line 13 before the connecting portion 12a of the narrow-width lines 12. More specifically, it is as follows.

Firstly, a principle of the generation of the SM defect will be explained. At a portion with a weak coverage, that is, at a portion where the embedding quality of the metal has deteriorated, there are many minute grains due to a growth of the grains being slow. At a grain boundary, due to including much crystal defects (vacancies), the crystal defects are condensed by a stress. Thus, at the portion where the embedding quality of the metal has deteriorated, initial voids tend to occur. Further, the initial voids grow because Cu existing in the portion moves by the stress (=the vacancies accumulate). That is, at the portion where the embedding quality of the metal has deteriorated, a stress-oriented migration defect occurs, and the portion comes to have the SM defect. In other words, the portion with the relatively weak metal coverage becomes an origin of the migration defect, and comes to have the SM defect.

According to a conventional semiconductor device, a portion with a weak metal embedding quality with respect to a wide-width line is only relevant to narrow-width lines, so the SM defect were occurring in a connecting portion of the narrow-width line.

Contrary to this, according to the semiconductor device of the present embodiment, the portion with the weak metal embedding quality with respect to the wide-width line 11 is the portion with a narrower linewidth than the narrow-width lines 12 (the intermediate portion 13c) among the connecting portion 12a of the narrow-width lines 12 and the sacrificial line 13. However, since the metal embedding quality in the intermediate portion 13c of the sacrificial line 13 is even weaker than the connecting portion 12a of the narrow-width line 12, the intermediate portion 13c becomes the origin of the migration with priority over the connecting portion 12a of the narrow-width line 12. Once the migration occurs in the intermediate portion 13c, the migration in the intermediate portion 13c acceleratedly progresses, so the SM defect is generated in the intermediate portion 13c with priority over the connecting portion 12a of the narrow-width line 12. Accordingly, the generation of the SM defect in the connecting portion 12a of the narrow-width line 12 is suppressed.

According to the present embodiment, as described above, by arranging the sacrificial line including the portion having the narrower linewidth than the narrow-width line 12, the SM defect is made to occur at the portion having the narrower linewidth than the narrow-width line 12 in the sacrificial line 13 with priority over the connecting portion 12a of the narrow-width line 12. Accordingly, the generation of the SM defect in the connecting portion 12a of the narrow-width line 12 can be suppressed. Accordingly, it becomes possible to suppress the decrease in the reliability and the yield of the semiconductor device caused by the generation of the SM defect.

Further, according to the present embodiment, the notched portion 11a is provided on the wide-width line 11 to suppress the SM defect, and the sacrificial line 13 is arranged in the area within the notched portion 11a. Accordingly, the SM defect can be suppressed without changing the linewidths of the wide-width line 11 and the narrow-width lines 12, and without increasing the chip area. Note that, since the notched portion 11a is provided on the wide-width line 11, a metal area of the wide-width line 11 is slightly decreased. Accordingly, a resistance value Rs of the wide-width line 11 slightly increases. However, such is acceptable so long as an increase amount of the resistance value Rs is within an allowable range.

Modification

Figure 4:
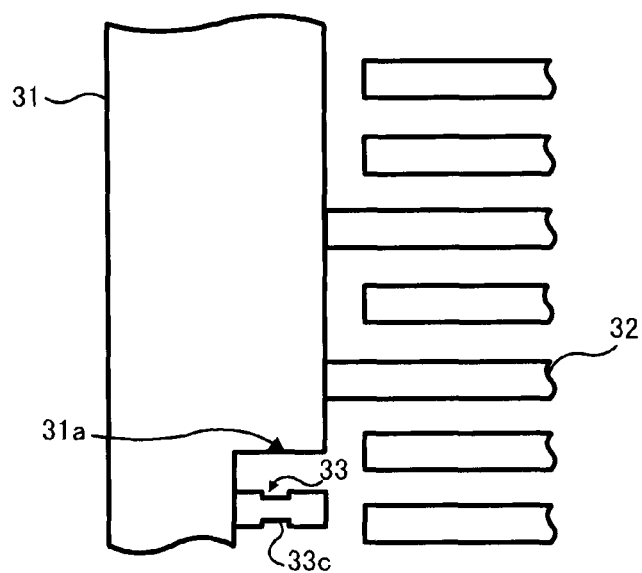
FIG. 4 is a top view showing a wiring pattern in a modification of the semiconductor device of the first embodiment.

FIG. 4 is a top view showing a wiring pattern in a modification of the semiconductor device of the first embodiment. As shown in FIG. 4, a notched portion 31a in which a sacrificial line 33 is to be formed may be formed at an end of a wide-width line 31 in accordance with an arrangement of the wide-width line 31 and narrow-width lines 32 connected to the line 31, or a space capable of being provided.

Second Embodiment

Figure 5:
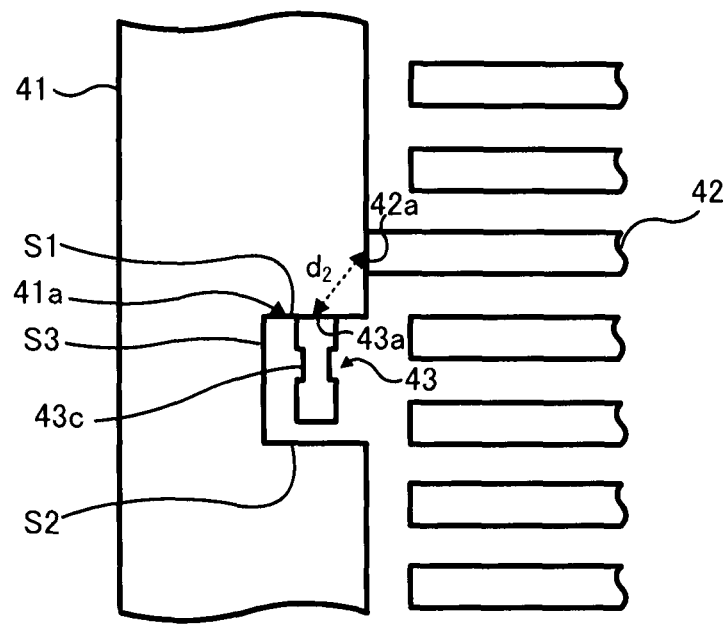
FIG. 5 is a top view showing a wiring pattern in a semiconductor device of a second embodiment.

FIG. 5 is a top view showing a wiring pattern in a semiconductor device of the second embodiment. As shown in FIG. 5, a sacrificial line 43 is arranged in a notched portion 41a and being vertical to a longitudinal direction of narrow-width lines 42. Hereinbelow, a semiconductor device of the second embodiment will be explained in detail. Note that, in the following explanation, explanations of configurations similar to the semiconductor device of the first embodiment will be omitted.

As shown in FIG. 5, the sacrificial line 43 is arranged in the notched portion 41a of a wide-width line 41 and being vertical to the longitudinal direction of the narrow-width lines 42, and a connecting portion 43a of the sacrificial line 43 is in contact with a side S1, among two sides S1, S2 that are vertical to a longitudinal direction of the wide-width line 41, that is closer to a connecting portion 42a of the narrow-width line 42.

In the present embodiment also, by arranging the sacrificial line 43 having a portion with a narrower linewidth than the narrow-width lines 42 (intermediate portion 43c), an occurrence of an SM defect at the connecting portion 42a of the narrow-width line 42 can be suppressed, and it becomes possible to suppress the decrease in the reliability and yield of the semiconductor device caused by the generation of the SM defect.

Further, even in the present embodiment also, by arranging the sacrificial line 43 in a region inside the notched portion 41a of the wide-width line 41, the SM defect can be suppressed without changing the linewidths of the wide-width line 41 and the narrow-width lines 42, and without increasing the chip area.

Further, according to the present embodiment, the sacrificial line 43 is arranged vertical to the longitudinal direction of the narrow-width lines 42 and is arranged to be in contact with the side S1 of the notched portion 41a where it is close to the connecting portion 42a of the narrow-width line 42. By arranging the sacrificial line 43 as above, compared to a case of arranging the sacrificial line 43 parallel to the longitudinal direction of the narrow-width lines 42, a distance $d_2$ between the connecting portion 42a of the narrow-width line 42 and the connecting portion 43a of the sacrificial line 43 can further be made shorter. Accordingly, the generation of the SM defect in the narrow-width line 42 can be suppressed at a higher certainty.

Modification

Figure 6:
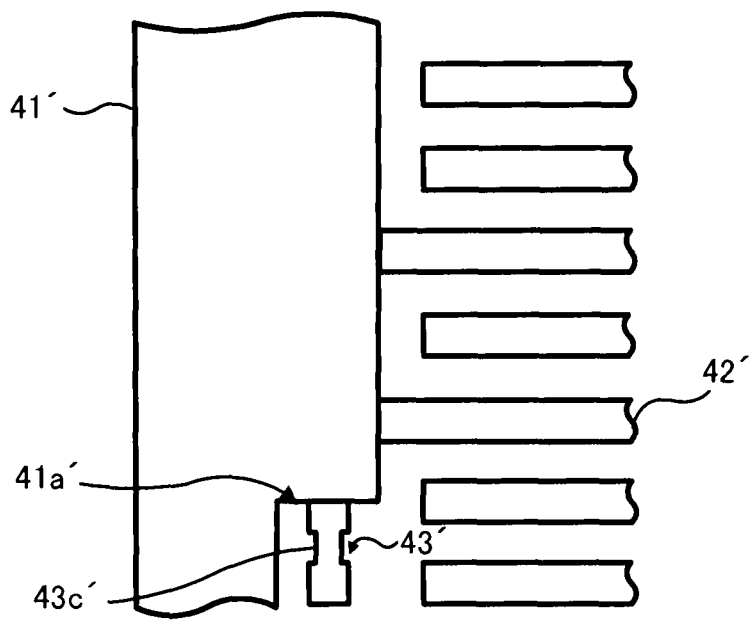
FIG. 6 is a top view showing a wiring pattern in a modification of the semiconductor device of the second embodiment.

FIG. 6 is a top view showing a wiring pattern in a modification of the semiconductor device of the second embodiment. As shown in FIG. 6, a notched portion 41a' in which a sacrificial line 43' is to be formed may be formed at an end of a wide-width line 41'.

Third Embodiment

Figure 7:
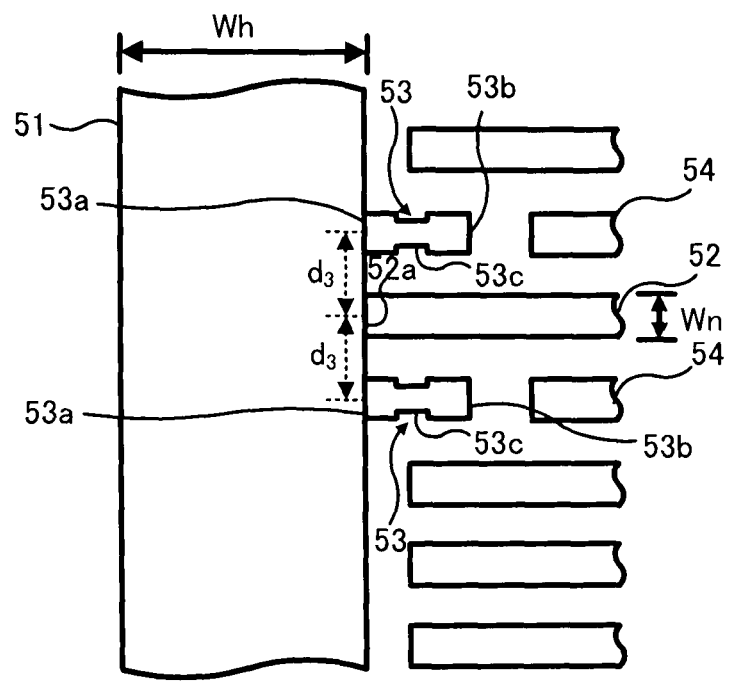
FIG. 7 is a top view showing a wiring pattern in a semiconductor device of a third embodiment.

FIG. 7 is a top view showing a wiring pattern in a semiconductor device of the third embodiment. As shown in FIG. 7, in the semiconductor device of the present embodiment, sacrificial lines 53 are arranged without providing a notched portion on a wide-width line 51. Hereinbelow, the semiconductor device of the third embodiment will be explained in detail. Note that, in the following explanation, an explanation of configurations similar to the semiconductor device of the first embodiment will be omitted.

In the semiconductor device of the present embodiment, the wide-width line 51 does not have the notched portion, and is a band-shaped wiring with a constant linewidth Wh regardless of the position therein.

The sacrificial lines 53 have their connecting portions 53a in contact with the wide-width line 51 near a connecting portion 52a of a narrow-width line 52. The sacrificial lines 53 are connected to the wide-width line 51 accordingly.

The sacrificial lines 53 have intervals with other narrow-width lines 54 not connecting to the wide-width line 51, and are arranged in parallel to the narrow-width lines 54. Note that, in order to prevent the sacrificial lines 53 and the other narrow-width lines 54 being short circuited and the sacrificial lines 53 affecting an electric character of the other narrow-width lines 54, at least a predetermined space needs to be provided between them.

Similar to the sacrificial line 13 in the first embodiment (FIG. 1), a linewidth of intermediate portions 53c of the sacrificial lines 53 in the present embodiment is partially narrower than a linewidth Wn of the narrow-width lines 52. Further, a linewidth of both ends 53a, 53b of the sacrificial lines 53 are preferably wider than the linewidth Wn of the narrow-width lines 52. By making the linewidth of the both ends 53a, 53b of the sacrificial lines 53 wider than the linewidth Wn of the narrow-width lines 52, the SM defect can be made to occur at the intermediate portions 53c with higher certainty.

For example, if the linewidth Wh of the wide-width line 51 is 0.5 µm and the linewidth Wn of the narrow-width lines 52 is 0.1 µm, it is preferable that the linewidth of the intermediate portions 53c is less than 0.1 µm and 0.07 µm or more and less than the linewidth Wn of the narrow-width lines 52, and the linewidth of the both ends 53a, 53b is 0.1 µm or less and the linewidth Wn of the narrow-width lines 52 or more. However, the linewidth of the both ends 53a, 53b of the sacrificial lines 53 may be about the same as the linewidth Wn of the narrow-width lines 52.

Further, lengths of the sacrificial lines 53 in the longitudinal direction are preferably 0.3 µm or more and three times or more of their respective linewidths and 0.5 µm or less. By forming the sacrificial lines 53 as above, the increase in the chip area is suppressed, and the SM defect can further be made sure to occur at the intermediate portions 53c of the sacrificial lines 53.

Further, for example, if the linewidth Wh of the wide-width line 51 is 0.5 µm and the linewidth Wn of the narrow-width line 52 is 0.1 µm, it is preferable that center distances $d_3$ between the connecting portion 52a of the narrow-width line 52 and the connecting portions 53a of the sacrificial lines 53 are 0.5 µm or less. As in this example, it is preferable that the center distances $d_3$ between the connecting portion 52a and the connecting portions 53a are at the linewidth Wh of the wide-width line 51 or less, or ten times the linewidth Wn of the narrow-width line 52 or less. If the center distance $d_3$ exceeds the linewidth Wh, or ten times the linewidth Wn, it becomes difficult to cause the SM defect to occur at the intermediate portions 53c of the sacrificial lines 53.

If the linewidth Wh of the wide-width line 51 is 0.5 µm and the linewidth Wn of the narrow-width line 52 is 0.1 µm, it is preferable that the center distances $d_3$ is 0.2 µm or less. As in this example, it is preferable that the center distances $d_3$ are two times the linewidth Wn of the narrow-width line 52 or less, or half the linewidth Wh of the wide-width line 51 or less. Further, in considering a manufacturing process of the sacrificial lines 53, it is preferable that the center distances $d_3$ between the connecting portion 52a and the connecting portions 53a are 0.2 µm or more.

Figure 8:
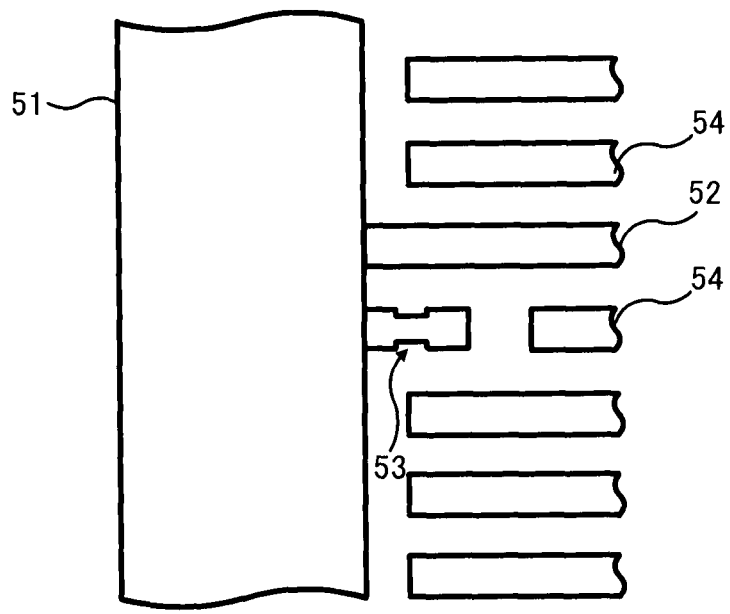
FIG. 8 is a top view showing a wiring pattern in a modification of the semiconductor device of the third embodiment.

The sacrificial lines 53 as explained above may, as shown in the drawing, be arranged on respective sides of the narrow-width line 52 by having the other narrow-width lines 54 in between them, or may be arranged on one side of the narrow-width line 52 as shown in FIG. 8.

In the present embodiment also, by arranging the sacrificial lines 53 having portions with narrower linewidth than the narrow-width line 52, an occurrence of an SM defect at the connecting portion 52a of the narrow-width line 52 can be suppressed, and it becomes possible to suppress the decrease in the reliability and yield of the semiconductor device caused by the generation of the SM defect.

Further, according to the present embodiment, since the sacrificial lines 53 are arranged without providing the notched portion on the wide-width line 51, so the metal area of the wide-width line 51 is not decreased. Accordingly, an increase of a resistance value Rs of the wide-width line 51 can be suppressed.

Figure 9:
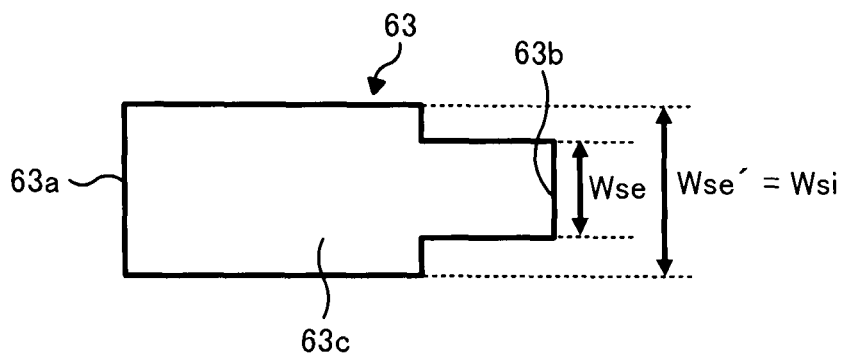
FIG. 9 is a top view showing a modification of the sacrificial line.
Figure 10:
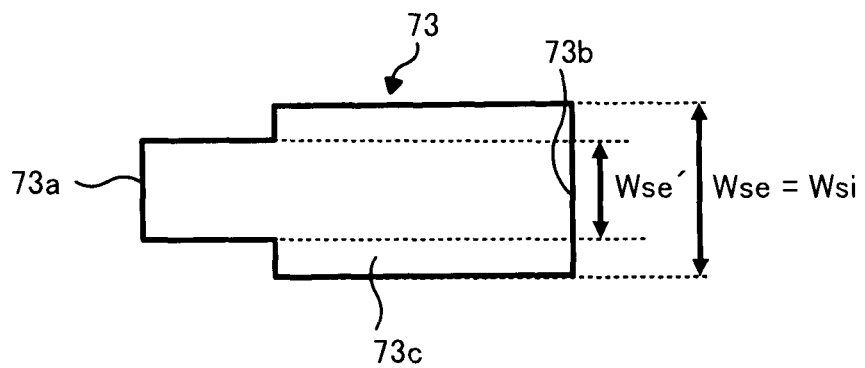
FIG. 10 is a top view showing a modification of the sacrificial line.
Figure 11:
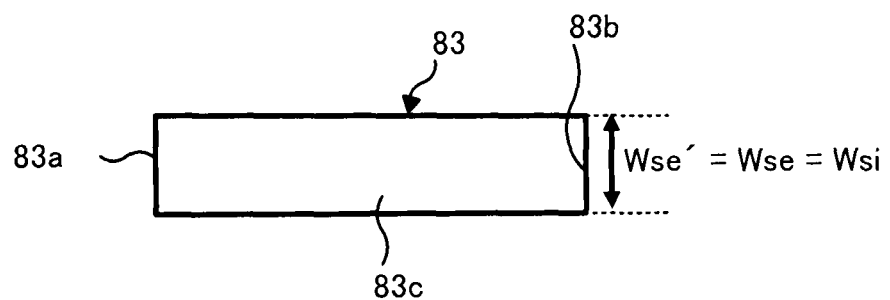
FIG. 11 is a top view showing a modification of the sacrificial line.

Note that, in the respective embodiments including the modifications, the portions within the sacrificial lines 13, 33, 43, 43' and 53 with the narrower linewidths than the narrow-width lines 12, 32, 42, 42' and 54 were the intermediate portions 13c, 33c, 43c, 43c' and 53c, respectively. However, in the sacrificial line, the portion having the narrower linewidth than the narrow-width lines does not necessarily have to be the intermediate portion. FIG. 9, FIG. 10 and FIG. 11 are each a top view showing a modification of the sacrificial line.

As shown in FIG. 9, in a sacrificial line 63, a linewidth Wse of another end 63b opposing a connecting portion 63a connecting with the wide-width line may be formed narrower than the linewidth of the narrow-width lines. Further, it is preferable that a linewidth Wse' of the connecting portion 63a and a linewidth Wsi of an intermediate portion 63c of the sacrificial line 63 are wider than the linewidth of the narrow-width lines.

Further, as shown in FIG. 10, in a sacrificial line 73, a linewidth Wse' of a connecting portion 73a connecting with the wide-width line may be formed narrower than the linewidth of the narrow-width lines. Further, it is preferable that a linewidth Wse of another end 73b opposing the connecting portion 73a and a linewidth Wsi of an intermediate portion 73c of the sacrificial line 73 are wider than the linewidth of the narrow-width lines.

Further, as shown in FIG. 11, in a sacrificial line 83, a linewidth Wse' of a connecting portion 83a connecting with the wide-width line, a linewidth Wse of another end 83b opposing the connecting portion 83a and a linewidth Wsi of an intermediate portion 83c may be formed narrower than the linewidth of the narrow-width lines; that is, a linewidth of the entire sacrificial line 83 may be formed narrower than the linewidth of the narrow-width lines.

However, as shown in FIG. 10 and FIG. 11, by making at least the linewidths of the connecting portions 73a, 83a connecting with the wide-width line narrower than the linewidth of the narrow-width lines, if voids formed at the portions 73a, 83a grow, there may be a case in which the voids go over onto the wide-width line. If the voids go over onto the wide-width line, the SM defect will occur at a part of the wide-width line. Accordingly, in order to suppress the voids from going over onto the wide-width line, as shown in FIG. 1, for example, it is preferable to make the intermediate portion 13c of the sacrificial line 13 narrower than the linewidth of the narrow-width lines 12, or make the another end 63b opposing the connecting portion 63a narrower than the linewidth of the narrow-width lines as shown in FIG. 9.

While certain embodiments have been described, the embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first line having a notched portion;

a second line connected to the first line and having a narrower linewidth than the first line; and a sacrificial line having one end connected to the first line and another end that is an open end, and at least partially having a portion with a narrower linewidth than the second line, the sacrificial line being arranged in the notched portion of the first line, wherein the sacrificial line extends in parallel to a plane formed by the first line and the second line.

2. The semiconductor device according to claim 1, wherein the sacrificial line has an intermediate portion between the one end and the another end, and within the sacrificial line, the portion with the narrower linewidth than the second line is the intermediate portion.

3. The semiconductor device according to claim 2, wherein a linewidth of the sacrificial line at the one end and the another end is wider than the second line.

4. The semiconductor device according to claim 2, wherein the notched portion is at a part of the first line.

5. The semiconductor device according to claim 4, wherein the second line has its longitudinal direction perpendicular to a longitudinal direction of the first line, and the sacrificial line is arranged with its longitudinal direction parallel to the longitudinal direction of the second line.

6. The semiconductor device according to claim 4 wherein the second line has its longitudinal direction perpendicular to a longitudinal direction of the first line, and the sacrificial line is arranged with its longitudinal direction perpendicular to the longitudinal direction of the second line.

7. The semiconductor device according to claim 2, wherein the notched portion is at an end of the first line.

8. The semiconductor device according to claim 7, wherein the second line has its longitudinal direction perpendicular to a longitudinal direction of the first line, and the sacrificial line is arranged with its longitudinal direction parallel to the longitudinal direction of the second line.

9. The semiconductor device according to claim 7, wherein the second line has its longitudinal direction perpendicular to a longitudinal direction of the first line, and the sacrificial line is arranged with its longitudinal direction perpendicular to the longitudinal direction of the second line.

10. The semiconductor device according to claim 1, wherein the portion with narrower linewidth than the second line within the sacrificial line is the another end of the sacrificial line.

11. The semiconductor device according to claim 10, wherein the sacrificial line has an intermediate portion between the one end and the another end, and a linewidth of the one end and a linewidth of the intermediate portion are respectively wider than the second line.

12. The semiconductor device according to claim 10, wherein the notched portion is at a part of the first line.

13. The semiconductor device according to claim 12, wherein the second line has its longitudinal direction perpendicular to a longitudinal direction of the first line, and the sacrificial line is arranged with its longitudinal direction parallel to the longitudinal direction of the second line.

14. The semiconductor device according to claim 12, wherein the second line has its longitudinal direction perpendicular to a longitudinal direction of the first line, and the sacrificial line is arranged with its longitudinal direction perpendicular to the longitudinal direction of the second line.

15. The semiconductor device according to claim 10, wherein the notched portion is at an end of the first line.

16. The semiconductor device according to claim 15, wherein the second line has its longitudinal direction perpendicular to a longitudinal direction of the first line, and the sacrificial line is arranged with its longitudinal direction parallel to the longitudinal direction of the second line.

17. The semiconductor device according to claim 15, wherein the second line has its longitudinal direction perpendicular to a longitudinal direction of the first line, and the sacrificial line is arranged with its longitudinal direction perpendicular to the longitudinal direction of the second line.

* * * * *